United States Patent
McParland et al.

(10) Patent No.: US 11,464,129 B1
(45) Date of Patent: Oct. 4, 2022

(54) MODULAR EDGE STORAGE DEVICES WITH HIGH SPEED INTERCONNECTS

(71) Applicant: Seagate Technology LLC, Cupertino, CA (US)

(72) Inventors: Paul McParland, San Jose, CA (US); Bruno Jean Masson, Longmont, CO (US); Jeffrey Dale Fochtman, San Jose, CA (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 31 days.

(21) Appl. No.: 16/695,832

(22) Filed: Nov. 26, 2019

(51) Int. Cl.
*H05K 7/00* (2006.01)
*H05K 7/14* (2006.01)

(52) U.S. Cl.
CPC ......... *H05K 7/1487* (2013.01); *H05K 7/1489* (2013.01); *H05K 7/1492* (2013.01)

(58) Field of Classification Search
CPC ... H05K 7/1487; H05K 7/1489; H05K 7/1492
See application file for complete search history.

(56) References Cited

U.S. PATENT DOCUMENTS

| | | | |
|---|---|---|---|
| 7,120,014 B2 | 10/2006 | Yang | |
| 7,405,928 B2 | 7/2008 | Robertson et al. | |
| 7,489,505 B2 | 2/2009 | Hong et al. | |
| 8,045,325 B2 | 10/2011 | Weng et al. | |
| 8,159,777 B2 | 4/2012 | Zadesky et al. | |
| 8,199,481 B2 | 6/2012 | Sivertsen | |
| 8,335,884 B2 | 12/2012 | Hamadani et al. | |
| 8,725,946 B2 * | 5/2014 | Petersen | G06F 3/0685 714/22 |
| D709,507 S | 7/2014 | McParland et al. | |
| 9,055,690 B2 | 6/2015 | Ross et al. | |
| 9,380,729 B2 | 6/2016 | Ross et al. | |
| 9,775,263 B2 | 9/2017 | Ross et al. | |
| 9,819,452 B2 | 11/2017 | Birrittella | |
| 10,068,619 B1 | 9/2018 | Chew et al. | |
| 10,133,697 B2 | 11/2018 | Blevins et al. | |
| 10,622,025 B2 * | 4/2020 | Gopalakrishna | H05K 7/1488 |
| 10,810,152 B2 * | 10/2020 | Gomez | G06F 13/4068 |
| 10,842,040 B2 * | 11/2020 | Doll | G06F 15/161 |
| 2005/0257232 A1 | 11/2005 | Hidaka | |

(Continued)

OTHER PUBLICATIONS

Matrox PCI and PCIe Guide, PCI and PCIe Technology Guide, Expansion Slots and Graphics Cards, Educational Resources, https://www.matrox.com/graphics/en/press/guides/addin/#close, 3 pages.

(Continued)

*Primary Examiner* — Rockshana D Chowdhury
(74) *Attorney, Agent, or Firm* — Westman, Champlin & Koehler, P.A.

(57) ABSTRACT

A data storage ecosystem that includes a series of devices of increasing size, designed to look and work together as a family, with at least one of the devices being a data storage device having a first consumer-accessible connector and a second high speed connector. The data storage ecosystem also includes a rack-mounted docking unit having a third high speed interfacing connector configured to couple to the second high speed connector of the data storage device when the data storage device is inserted into the rack-mounted docking unit.

15 Claims, 9 Drawing Sheets

(56) References Cited

U.S. PATENT DOCUMENTS

| | | | |
|---|---|---|---|
| 2007/0204095 A1 | 8/2007 | Sandy et al. | |
| 2007/0233781 A1 | 10/2007 | Starr et al. | |
| 2008/0191590 A1 | 8/2008 | Lin et al. | |
| 2010/0238623 A1 | 9/2010 | Pan | |
| 2011/0320653 A1 | 12/2011 | Lais et al. | |
| 2013/0073766 A1 | 3/2013 | Gregg et al. | |
| 2014/0355478 A1 | 12/2014 | Cha | |
| 2015/0032286 A1 | 1/2015 | Balakrishnan et al. | |
| 2016/0073544 A1* | 3/2016 | Heyd | G06F 1/20 361/679.31 |
| 2017/0262027 A1* | 9/2017 | Farington | G11C 16/04 |
| 2018/0070469 A1* | 3/2018 | Hofmann | H05K 7/1489 |
| 2018/0338384 A1* | 11/2018 | Chu | H05K 7/1492 |
| 2019/0141851 A1* | 5/2019 | Chen | H01R 12/79 |
| 2019/0294578 A1* | 9/2019 | Arnouse | G06F 1/1628 |

OTHER PUBLICATIONS https://www.open19.org/project/, © 2019 Open19 Foundation, printed Dec. 6, 2019, 15 pages.

https://www.hyperscalers.com/ocp-co-lo-compliant-requirements-hyperscale-specification-buy-order, Open Rack v1-2 Physical Specifications and Location Requirements, printed Dec. 6, 2019, Copyright © Hyperscalers HyperScalers (http://www.hyperscalers.com/), All rights reserved, 7 pages.

\* cited by examiner

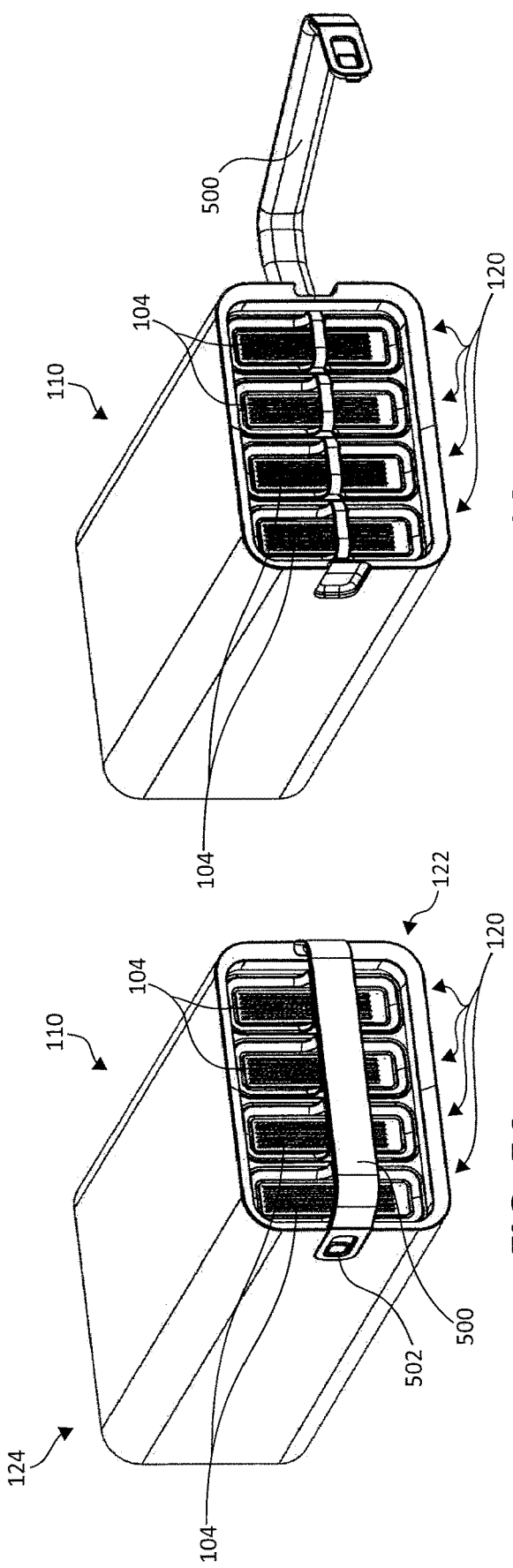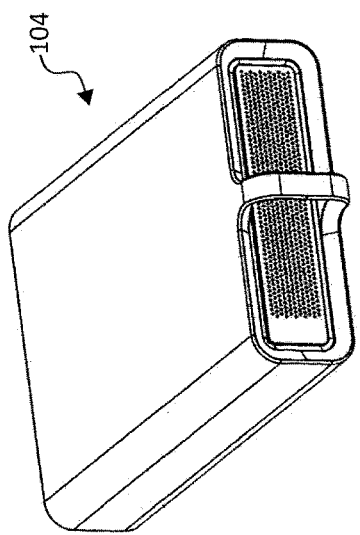

MODULAR EDGE STORAGE DEVICES WITH HIGH SPEED INTERCONNECTS

SUMMARY

In one embodiment, a system includes a rack-mounted docking unit having a first interfacing connector. The system also includes a multi-drive data storage device, insertable into the rack-mounted docking unit, comprising a plurality of non-removable data storage drives and a back end having a second interfacing connector. The multi-drive data storage device is configured to connect to a computer and to store data generated by the computer, and the second interfacing connector is configured to operably couple to the first interfacing connector when the multi-drive data storage device is inserted into the rack-mounted docking unit. The system also includes a single-drive data storage device configured to be independently connected to the computer and to store the data generated by the computer. The system additionally includes a multi-device dock comprising a plurality of slots, with each of the plurality of slots configured to removably receive the single-drive data storage device. The multi-device dock having a front end comprising an opening into the slots and a back end having a third interfacing connector. The third interfacing connector is configured to operably couple the single-drive data storage device to the first interfacing connector when the single-drive data storage device is within one of the plurality of slots and when the multi-device dock is inserted into the rack-mounted docking unit.

In another embodiment, an apparatus includes a data storage device having a first consumer-accessible connector and a second high speed connector. The system also includes a rack-mounted docking unit having a third high speed interfacing connector configured to couple to the second high speed connector of the data storage device when the data storage device is inserted into the rack-mounted docking unit.

In yet another embodiment, a method includes enabling a data storage device to communicate with a first computer via a consumer-accessible connector. The method also includes enabling the data storage device to automatically couple to an interfacing connector in a rack-mounted docking unit via a second high speed connector when the data storage device is inserted into the rack-mounted docking unit.

This summary is not intended to describe each disclosed embodiment or every implementation of the modular edge storage devices with high speed interconnects. Many other novel advantages, features, and relationships will become apparent as this description proceeds. The figures and the description that follow more particularly exemplify illustrative embodiments.

BRIEF DESCRIPTION OF THE DRAWINGS

FIGS. 2A-7B are diagrammatic illustrations showing different connectors in the different devices of the data storage ecosystem described above in connection with FIG. 1.

DETAILED DESCRIPTION

Figure 1:
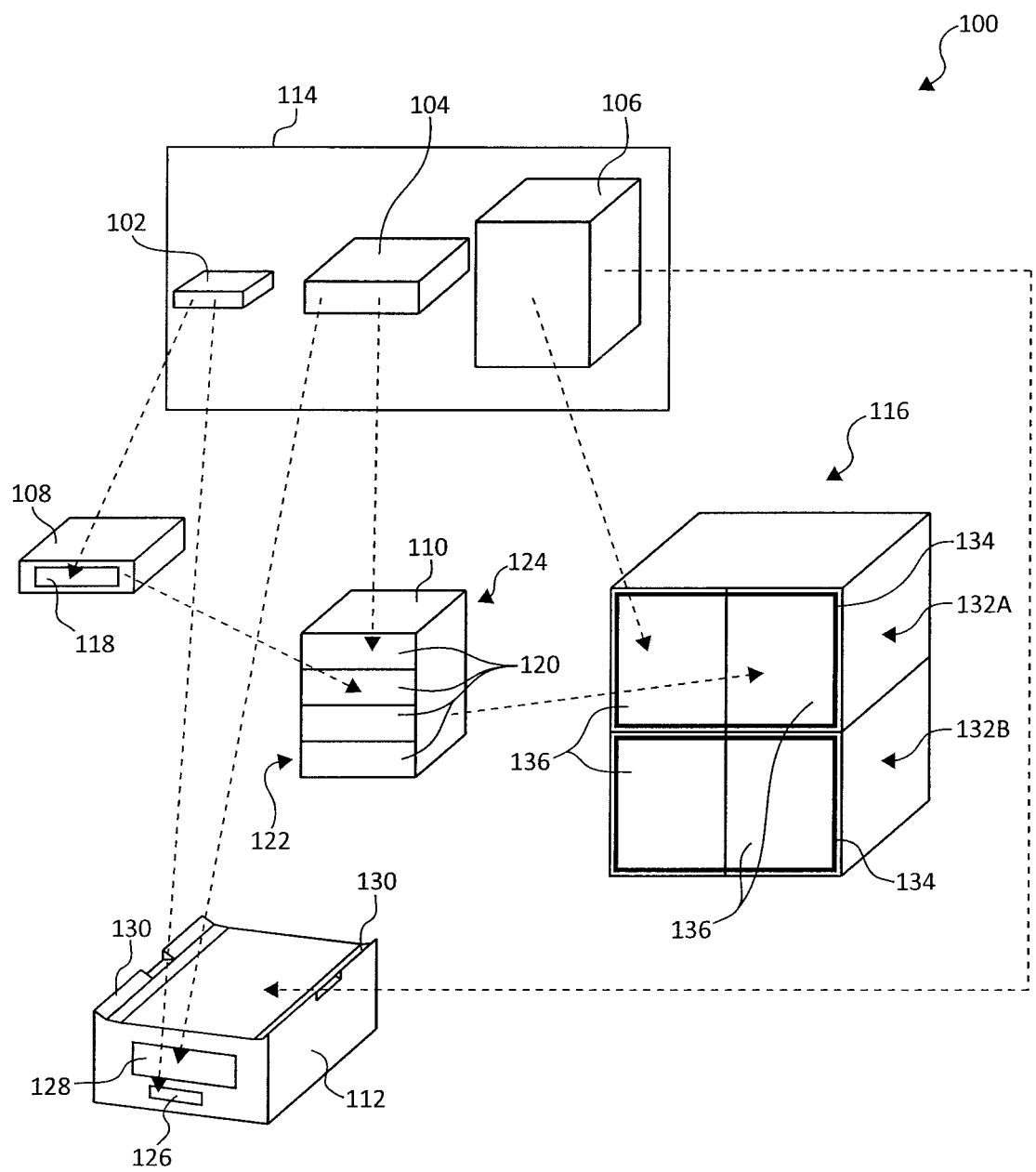
FIG. 1 is a diagrammatic illustration of a data storage ecosystem in accordance with one embodiment.

Embodiments described herein provide an ecosystem of devices for moving data from a point of creation (e.g., in a camera or other sensor in an autonomous vehicle) through the initial offload of that newly created data into a larger storage array for transport, and ultimately for processing at a data center. The ecosystem includes a series of devices of increasing size, designed to look and work together as a family.

Currently, for example, autonomous vehicle developers use solid-state drives (SSDs) in custom computing rigs to store data that the vehicles create, and then physically remove those SSDs and install them in personal computers (PCs) in a workshop to transfer the data. To collect all the generated data, the data from the PCs may be transferred to servers over a local area network (LAN), or closed ecosystem products such as Amazon Web Services (AWS) Snowball or Google's Cloud Data Transfer Appliance may be used to physically move that data to a cloud account.

Further, current consumer storage devices are not designed to work with data center or edge data center products. There is no direct connectivity provided, and the only way to transfer data is via network connections (e.g., switches) if the consumer storage device is so equipped. In general, consumer storage devices include consumer-accessible connections (e.g., universal serial bus (USB) connections and Thunderbolt connections), which may allow for relatively slow data throughput. Thus, even if the consumer data storage device is a high-speed data storage device, it may not realize its full data throughput potential when connected to a much higher speed data center type device because high speed lanes within the high-speed consumer data storage device saturate the relatively low-speed consumer connections.

To address the above-noted problems, embodiments of the disclosure provide an ecosystem of connected and compatible storage devices that scale to a customer's needs and work seamlessly together. The system is also agnostic to a final storage endpoint. Further, embodiments of the disclosure introduce a dedicated port on each end of the storage ecosystem to enable a new data transfer path (e.g., a peripheral component interconnect express (PCIe) data transfer path) from the consumer device to the data center/edge data center device, thus establishing simple connectivity and enabling very fast transfer times. Details regarding embodiments of the disclosure are provided below in connection with FIGS. 1-7B.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It will be understood that when an element is referred to as being "connected," "coupled," or "attached" to another element, it can be directly connected, coupled or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled or attached to each other.

FIG. 1 is a diagrammatic illustration of a data storage ecosystem 100 in accordance with one embodiment. Data storage ecosystem 100 includes a memory card 102, a single-drive data storage device 104, a multi-drive data storage device 106, a memory card ingester 108, a multi-device dock 110, and a multi-device ingester 112. In FIG. 1, box 114 represents a data collection site (e.g., a movie studio, a cabin/dashboard of an autonomous vehicle, etc.), and element 116 is an example of a data center rack.

Memory card 102 is a smallest of the data storage devices in ecosystem 100. Memory card 102 can be inserted into a card slot of, for example, a camera and may store images and video obtained by the camera. Data from memory card 102 may be transferred to other devices within ecosystem 100 using different techniques that are described further below.

Single-drive data storage device 104 may, in some embodiments, be an external consumer data storage drive that is portable and easily connectable to a desktop computer, a laptop computer or any other computer via a consumer-accessible connection (e.g., a USB connection or Thunderbolt connection), which may be a relatively low speed connection. In some embodiments, device 104 may include a high-speed connector in addition to, or instead of, the relatively low speed connector. Details regarding external data storage drives with high speed connectors are provided further below. In different embodiments, external consumer data storage drive 104 may include a hard disk drive (HDD), which is an electromechanical device containing spinning data storage disks and movable read/write heads, a SSD, which uses electronic memory chips (e.g. one or more solid-state Flash memory chips) and contains no moving parts, or a hybrid drive, which combines features of HDDs and SSDs in one unit. The single data storage drive (e.g., the HDD, SSD or hybrid drive) is enclosed in a suitable casing, and the one or more connectors (e.g., the USB connector and the high-speed connector) extend outside the casing, thereby enabling connection of the single-drive data storage device 104 to a computer. Single-drive data storage device 104 can be docked into multi-device dock 110 in a manner described further below.

Multi-drive data storage device 106 includes multiple non-removable data storage drives within a single casing. Each of the multiple non-removable data storage drives may be a HDD, a SSD or a hybrid drive. Multi-drive data storage device 106 may also include control circuitry housed inside the casing that enables communication between individual ones of the multiple data storage drives housed within the casing. The control circuitry may also be coupled to one or more connectors that extend outside the casing and enable the multi-drive data storage device 106 to be communicatively coupled to a computer. Such connections are described further below.

Memory card ingester 108 includes a slot 118 that is capable of receiving memory card 102. Memory card ingester 108 also includes internal circuitry (not shown) that is configured to couple to memory card 108 when memory card 108 is properly inserted in slot 118. Memory card ingester 108 further includes external connectors (not shown in FIG. 1) coupled to the internal circuitry. The internal circuitry and external connectors of memory card ingester 108 are configured to help transfer data from memory card 102 to other devices. In some embodiments, memory card ingester 108 may be of a substantially same size as single-drive data storage device 104, and can be docked into multi-device dock 110 in a manner described below.

In some embodiments, multi-device dock 110 includes multiple slots 120, with each of the multiple slots being capable of removably receiving a single-drive data storage device such as 104 or memory card ingester 108. The multi-device dock 110 has a front end 122 that includes openings into the slots 120 and a back end 124 that has at least one interfacing connector (not shown). The interfacing connector is capable of operably coupling single-drive data storage device 104 or memory card ingester 108 to a data center device (e.g., a device within rack 116) when the single-drive data storage device 104 or memory card ingester 108 is within slot 120 and when the multi-device dock 110 is inserted into an enclosure of the data center rack 116. As will be described further below, this enables high speed data transfers from single-drive data storage device 104 or from memory card ingester 108 to the data center device to be carried out.

Multi-device ingester 112 includes a first slot 126 that is capable of receiving memory card 102, a second slot 128 that is capable of receiving single-drive data storage device 104, and an upper portion 130 that is configured to fit multi-drive data storage device 106. Multi-device ingester 112 also includes internal circuitry (not shown) that is configured to couple to memory card 108 and to single-drive data storage device 104 when memory card 108 and single-drive data storage device 104 are inserted into slots 126 and 128, respectively. Multi-device ingester 112 further includes external connectors (not shown) coupled to the internal circuitry. The internal circuitry and external connectors of multi-device ingester 112 are configured to help transfer data from memory card 102 and single-drive data storage device 104 to other devices.

As noted above, box 114 represents a data collection site. As indicated above, one example of data collection site 114 where a large volume of data is generated is an autonomous vehicle that may have a number of sensors that capture information, which may need to be stored. Single-drive data storage device 104, which is typically relatively light in weight, may be suitable for coupling to a computer of the autonomous vehicle and for storing such sensor-generated data. As noted above, another example of data collection site 114 is a movie studio at which a large volume of captured video footage may need to be stored. Multi-drive data storage device 106 may be suitable for storing the large volume of video data. As noted above, memory card 102 can be inserted into a card slot of, for example, a camera and may store images and video obtained by the camera. In embodiments of the disclosure, data from device 102, 104 and 106 may be transferred at a high speed to devices in a data center.

Data center rack 116 may be one of multiple racks in, for example, an edge data center. Data center rack 116 includes multiple enclosures 132A, 132B, etc., which may be stacked vertically, for example. Each enclosure 132A, 132B may include a docking unit 134 having multiple slots 136 (e.g., 2 slots), with each slot 136 sized to receive either a multi-drive data storage device 106 or a multi-device dock 110 since, in some embodiments, multi-drive data storage device 106 and multi-device dock 110 have a substantially same size. Each enclosure 132A, 132B may further include other components such as field-replaceable modules (FRMs) (not shown in FIG. 1). When either multi-drive data storage device 106 or multi-device dock 110 is docked in a rack unit slot 136, connectors of the multi-drive data storage device 106 or connectors of the multi-device dock 110 are coupled to interfacing connectors (not shown in FIG. 1) of the enclosures 132A, 132B, and, with the help of the FRMs in the enclosures 132A, 132B, data from the multi-drive data storage device 106 and/or data from, for example, one or more single-drive data storage devices 104 in the multi-device dock 110 are transferred at a high speed to, for example, a server in the edge data center.

As indicated earlier, the above-described ecosystem of compatible storage devices scale to a customer's needs and work seamlessly together; and the system is agnostic to a final storage endpoint. Thus, as indicated above, the system 100 enables a user to gather data at a site (e.g., a movie studio, a cabin/dashboard of an autonomous vehicle, etc.) by storing the data on, for example, single-drive data storage device 104 or multi-drive data storage device 110 and, upon completion of the data gathering, easily carry the device 104, 110 to an edge data center, transfer the data to a server at the edge data center, and reuse the device 104, 110 for data gathering.

Figure 2A:
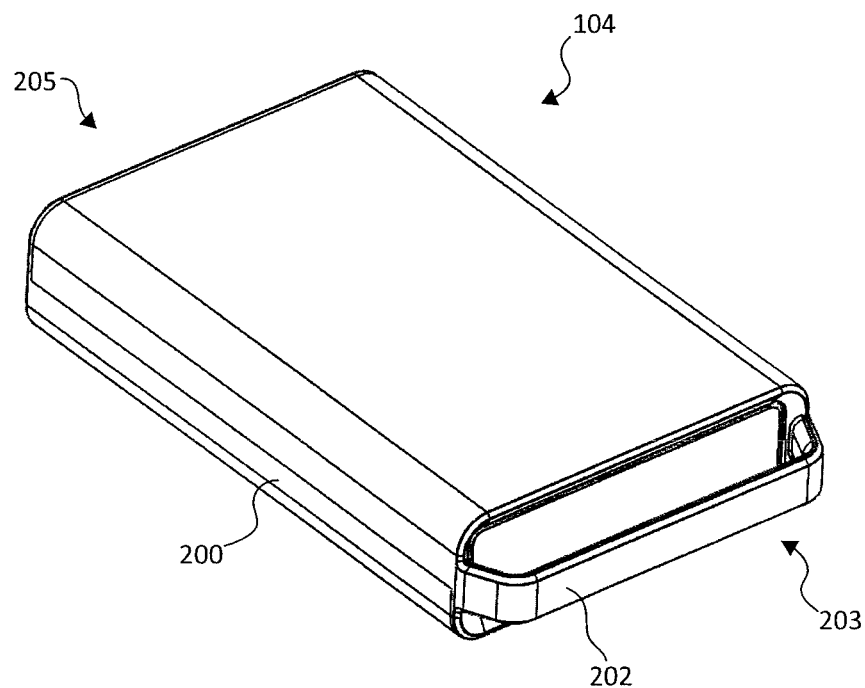
Figure 2B:
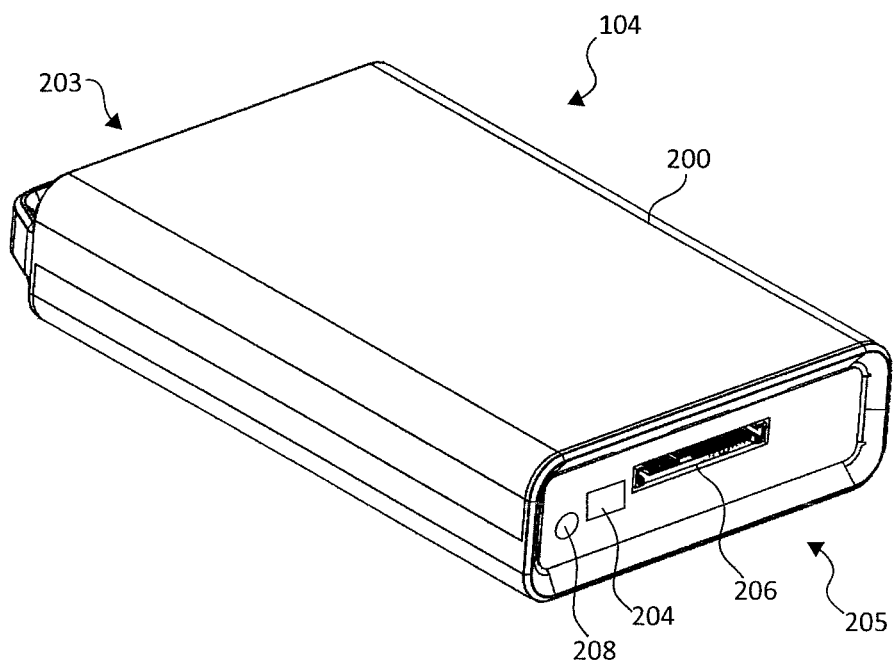

FIGS. 2A-7B are diagrammatic illustrations showing different connectors in the different devices of the data storage ecosystem 100 described above in connection with FIG. 1. FIG. 2A and 2B are perspective views showing a front and a rear, respectively, of single-drive data storage device 104 in accordance with one embodiment. Device 104 includes a casing 200, a handle 202 located at a front 203 of the casing 200, and connectors 204, 206 and 208 located at a rear 205 of the casing 200. In FIG. 2A, handle 202 extends along a width direction of the front 203 of the casing 200. However, in certain other embodiments (e.g., an embodiment shown in FIG. 5C) handle 202 may extend along a height of casing 200. In general, handle 202 and connectors 204, 206 and 208 may be in any suitable location. In the embodiment of FIGS. 2A and 2B, connector 204 is a low speed connector (e.g., USB connector), and connector 206 is a high speed connector (e.g., a PCIe connector). Low speed connector 204 may be used for connecting single-drive data storage device 104 to a computer (e.g., a general-purpose computer, an autonomous vehicle computer, etc.) for data gathering. As will be described further below, data stored in the single-drive data storage device 104 may be transferred to a data center device by coupling the single-drive data storage device 102 to the data center device via high speed connector 206. Connector 208 is a power connector (e.g., a direct current (DC) power connector).

Figure 3A:
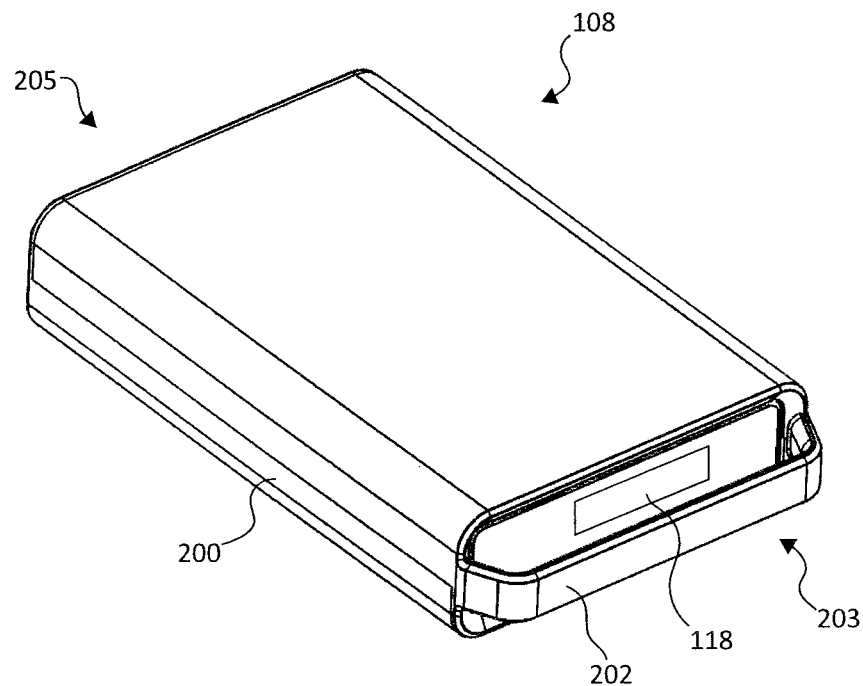
Figure 3B:
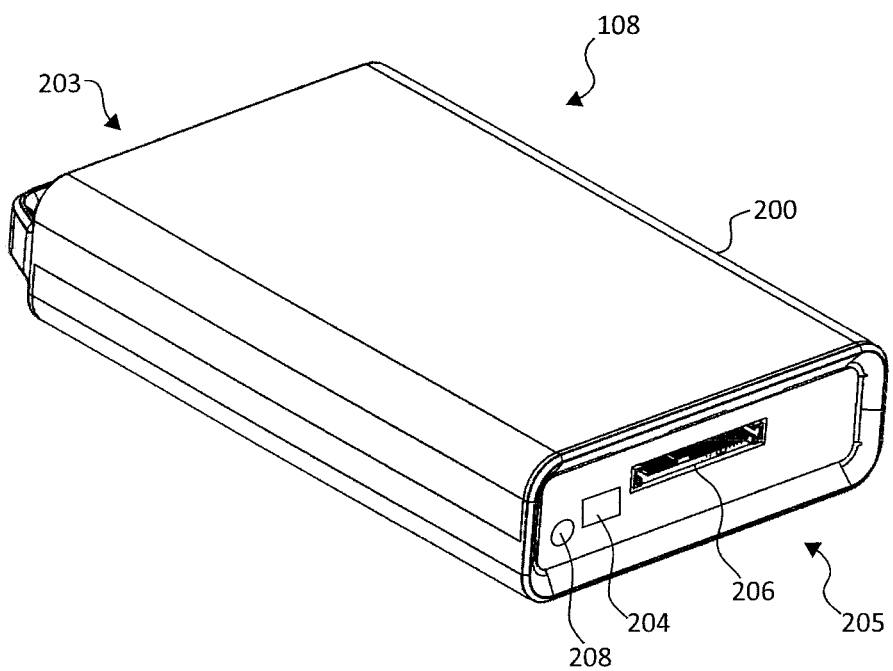

FIGS. 3A and 3B are perspective views showing a front and a rear, respectively, of memory card ingester 108 in accordance with one embodiment. Handle 202 and connectors 204, 206 and 208 included in single-drive data storage device 104 are also included in memory card ingester 108. Further, as described above in connection with FIG. 1, memory card ingester 108 includes slot 118 that is capable of receiving memory card 102 (shown in FIG. 1). When memory card 102 is installed into slot 118, data may be stored into memory card 102 by connecting memory card ingester 108 to a computer via low speed connector 204. Data stored in memory card 102 may be transferred to a data center device by coupling the memory card ingester 108 with the memory card 102 therein to the data center device via high speed connector 206.

Figure 4A:
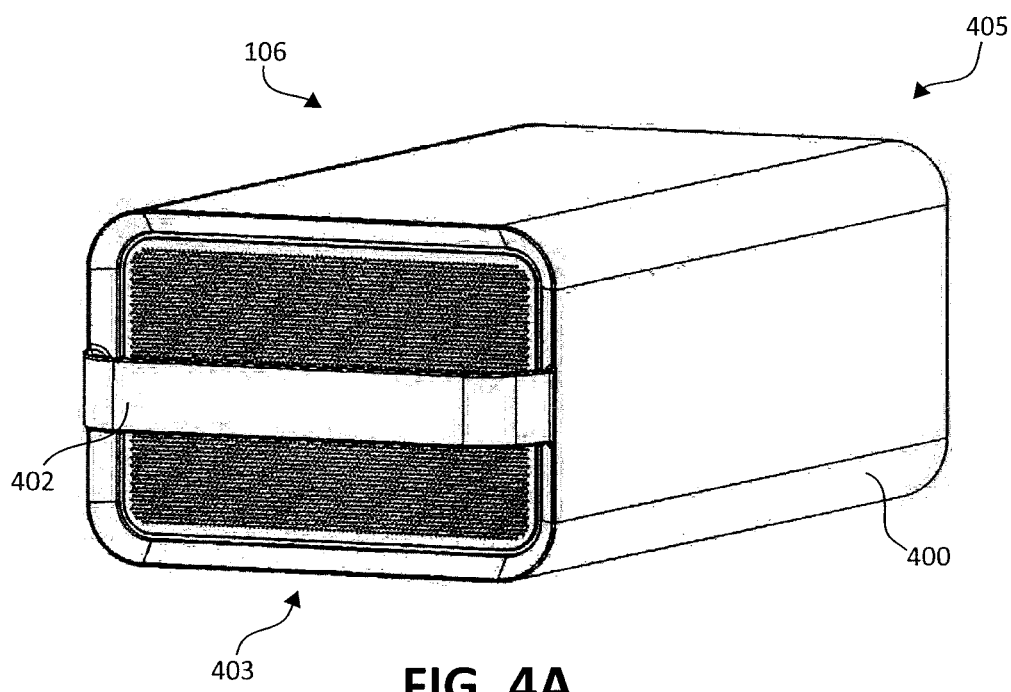
Figure 4B:
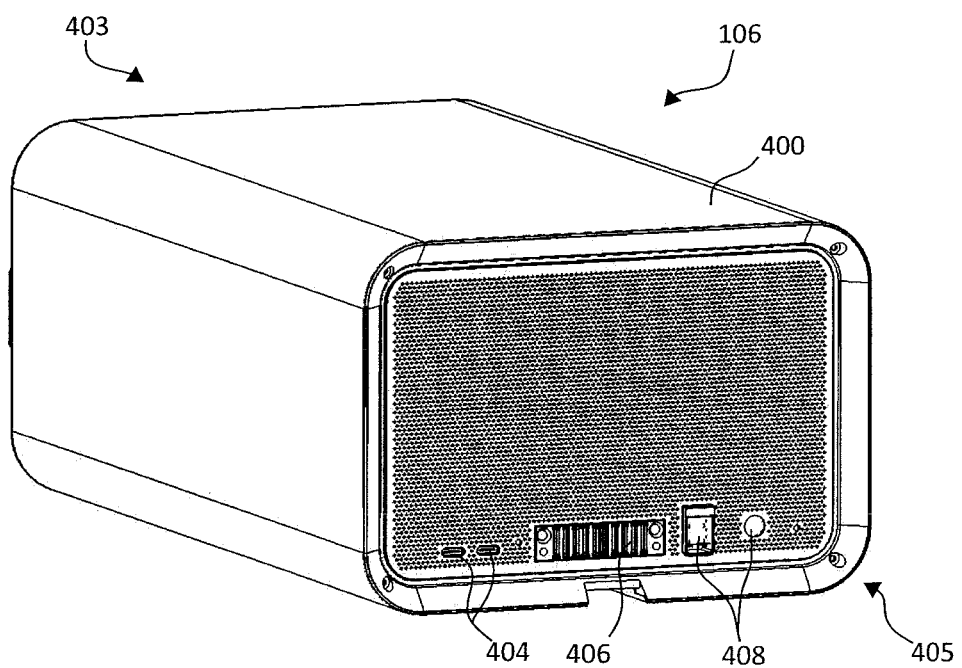
Figure 4C:
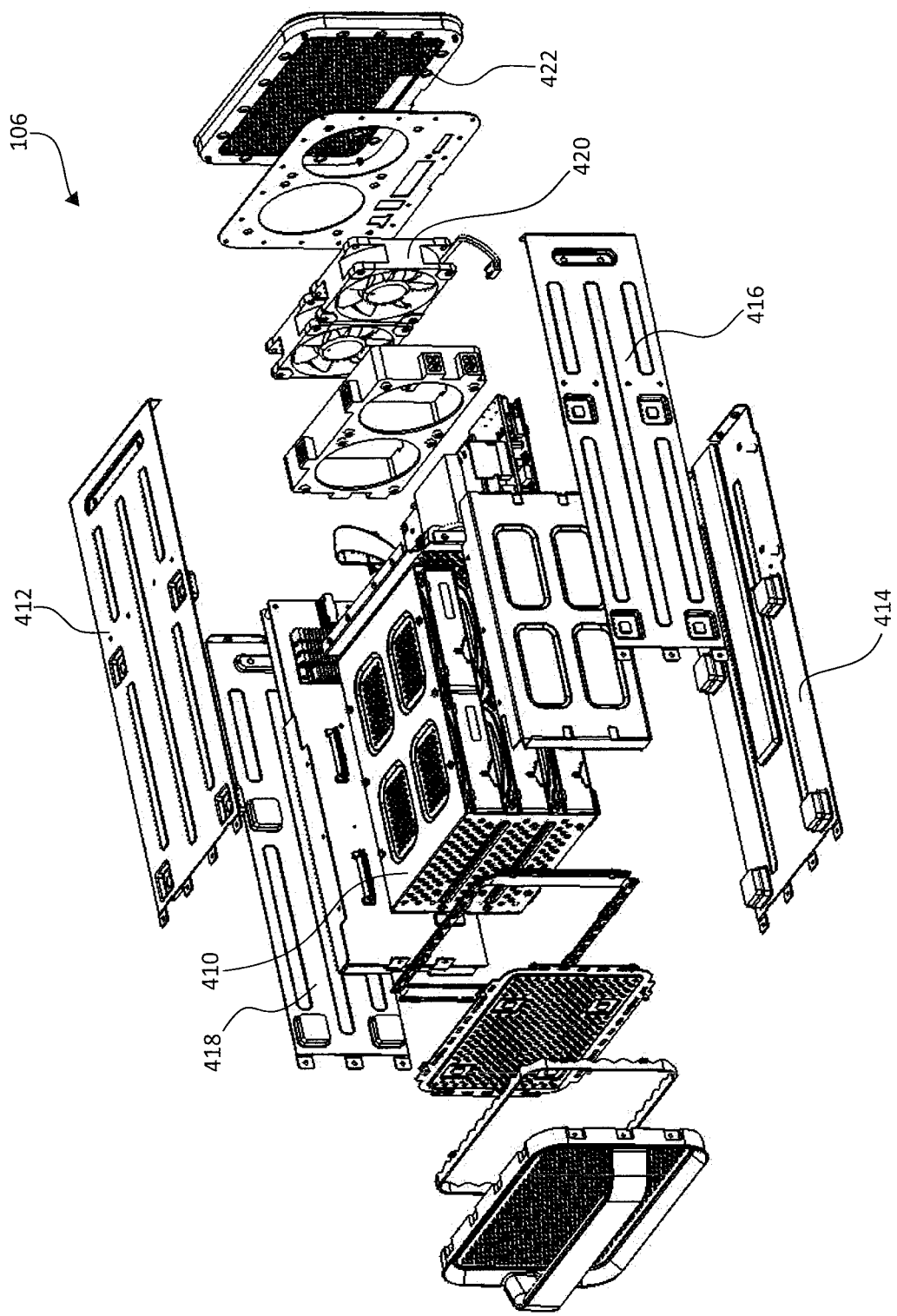

FIGS. 4A and 4B are perspective views showing a front and a rear, respectively, of a multi-drive data storage device 106 in accordance with one embodiment, and FIG. 4C is an exploded view of the multi-drive data storage device 106. Device 106 includes a casing 400, a handle 402 located at a front 403 of the casing 400, and connectors 404, 406 and 408 located at a rear 405 of the casing 400. In FIG. 4A, handle 402 extends along a width direction of the front 403 of the casing 400. However, in certain other embodiments handle 202 may extend along a height of casing 400. In general, handle 402 and connectors 404, 406 and 408 may be in any suitable location. In the embodiment of FIGS. 4A and 4B, connectors 404 are consumer-accessible connectors (e.g., USB connector and/or Thunderbolt connector), and connector 406 is a high speed connector (e.g., a PCIe connector). Consumer-accessible connectors 404 may be used for connecting multi-drive data storage device 106 to a computer (e.g., a general-purpose computer, an autonomous vehicle computer, etc.) for data gathering. As will be described further below, data stored in the multi-drive data storage device 106 may be transferred to a data center device by coupling the multi-drive data storage device 106 to the data center device via high speed connector 406. Connectors 408 are power connectors.

In the exploded view of FIG. 4C, block 410 includes multiple data drives (e.g., SSDs). In a particular embodiment, 6 SSDs, which may operate in a redundant array of independent discs (RAID) configuration, are included within block 410. Block 410 is protected by a casing that includes top cover portion 412, bottom cover portion 414 and side cover portions 416 and 418. Data storage drives within block 410 are cooled during operation by fans 420. Back panel 422 includes connectors 404, 406 and 408 shown in FIG. 4B and described above.

FIGS. 5A and 5B are perspective views showing a front of multi-device dock 110 in accordance with one embodiment. FIG. 5C is a perspective view of a single-drive data storage device 104 that is insertable into a slot 120 of the multi-device dock 110. As described above in connection with FIG. 1, multi-device dock 110 has a front end 122 that includes openings into the slots 120 and a back end 124 that has at least one interfacing connector (not shown). In the embodiment of FIGS. 5A and 5B, front end 122 includes a handle 500 that can be either in a closed position (shown in FIG. 5A) or an open position (shown in FIG. 5B). When handle 500 is in the open position shown in FIG. 5B, single-drive data storage devices 104 may be inserted into slots 120. In the closed position shown in FIG. 5A, handle 500 may be held in place by a suitable latching mechanism 502. In one embodiment, multi-device dock 110 serves as a dock for just a bunch of discs (JBOD). Back or rear end 124 of multi-device dock 110 has connectors that are substantially similar to connectors 404, 406 and 408 shown in FIG. 4B and described above. Thus, in the interest of brevity, the connectors of multi-device dock 110 are not separately shown and described. As described above in connection with FIG. 1, an interfacing connector (e.g., a high speed connector) of multi-device dock 110 is capable of operably coupling a high speed connection of single-drive data storage device 104 or memory card ingester 108 to a data center device (e.g., a computing device within rack 116) when the single-drive data storage device 104 or memory card ingester 108 is within slot 120 and when the multi-device dock 110 is inserted into an enclosure of the data center rack 116.

Figure 6B:
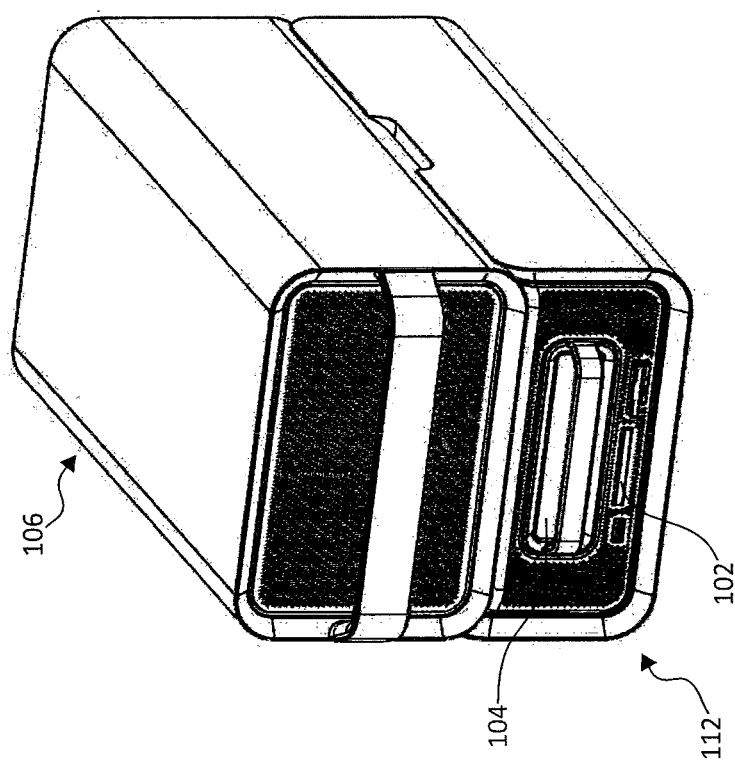
Figure 6A:
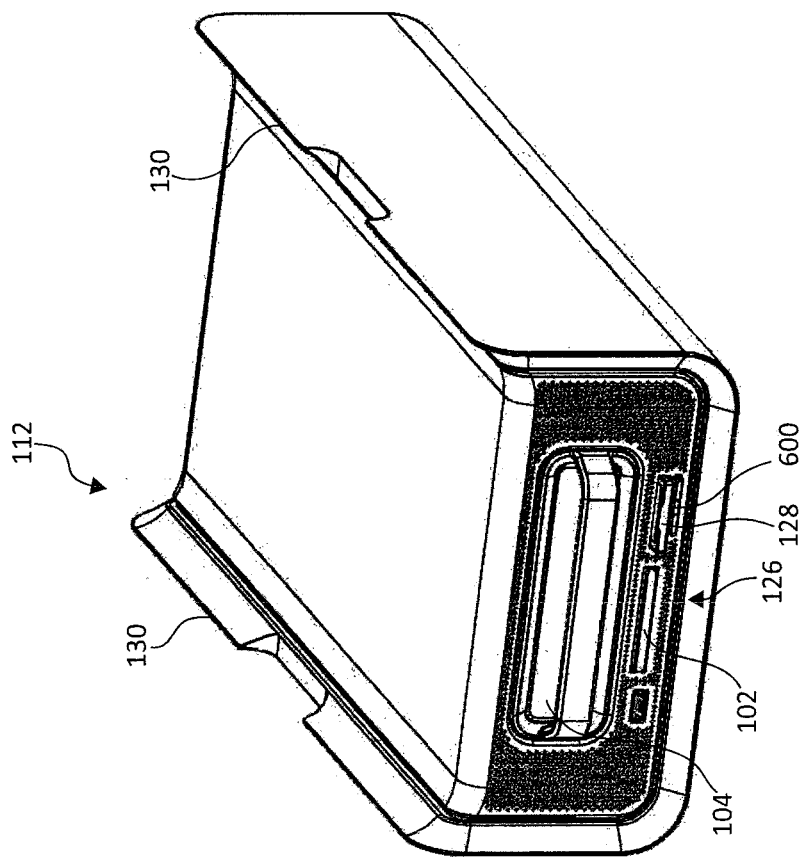

FIG. 6A is a perspective view showing a front of multi-device ingester 112 in accordance with one embodiment. FIG. 6A shows ingester 112 with a memory card 102 in first slot 126 and a single-drive data storage device 104 in second slot 128. In some embodiments, multi-device ingester 112 may include one or more additional slots 600 that are configured to receive memory cards of a different size than memory card 102. As noted above, multi-device ingester 112 also includes internal circuitry (not shown) that is configured to couple to memory card 102 and to single-drive data storage device 104. The circuitry enables data to be transferred from, for example, memory card 102 to single-drive data storage device 104. As indicated above, the internal circuitry and external connectors (not shown) of multi-device ingester 112 are configured to help transfer data from memory card 102 and single-drive data storage device 104 to other devices.

Figure 6C:
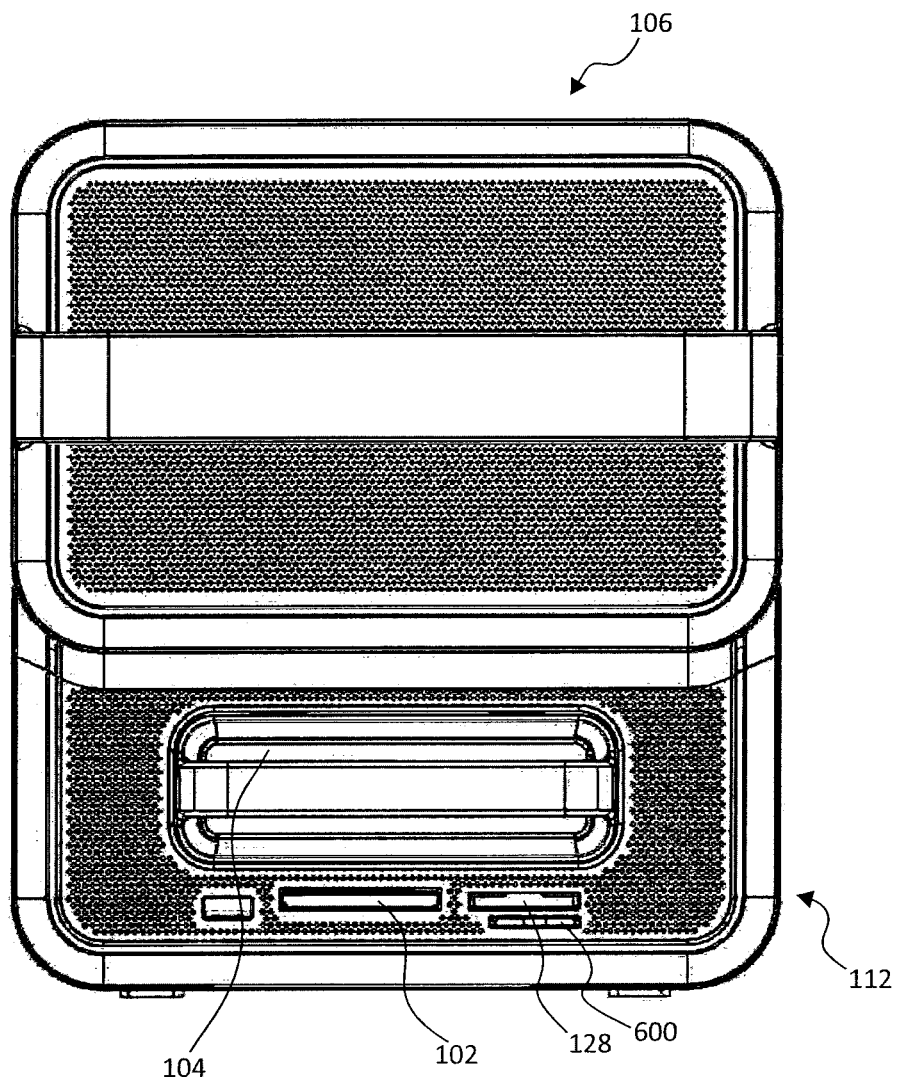

FIGS. 6B and 6C show perspective and front views, respectively, of multi-device ingester 112 with a multi-drive data storage device 106 mounted on its upper portion 130. A host computer (not shown) may be operably connected to multi-device ingester 112, which, in turn, may be operably connected to multi-drive data storage device 106. In such a daisy chain connection configuration, a user of the host computer may "drag and drop" data files from, for example, single-drive data storage device 104 to multi-drive data storage device 106. Also, from the host computer, the user may initiate a transfer of all data from single-drive data storage device 104 to multi-drive data storage device 106.

Figure 7A:
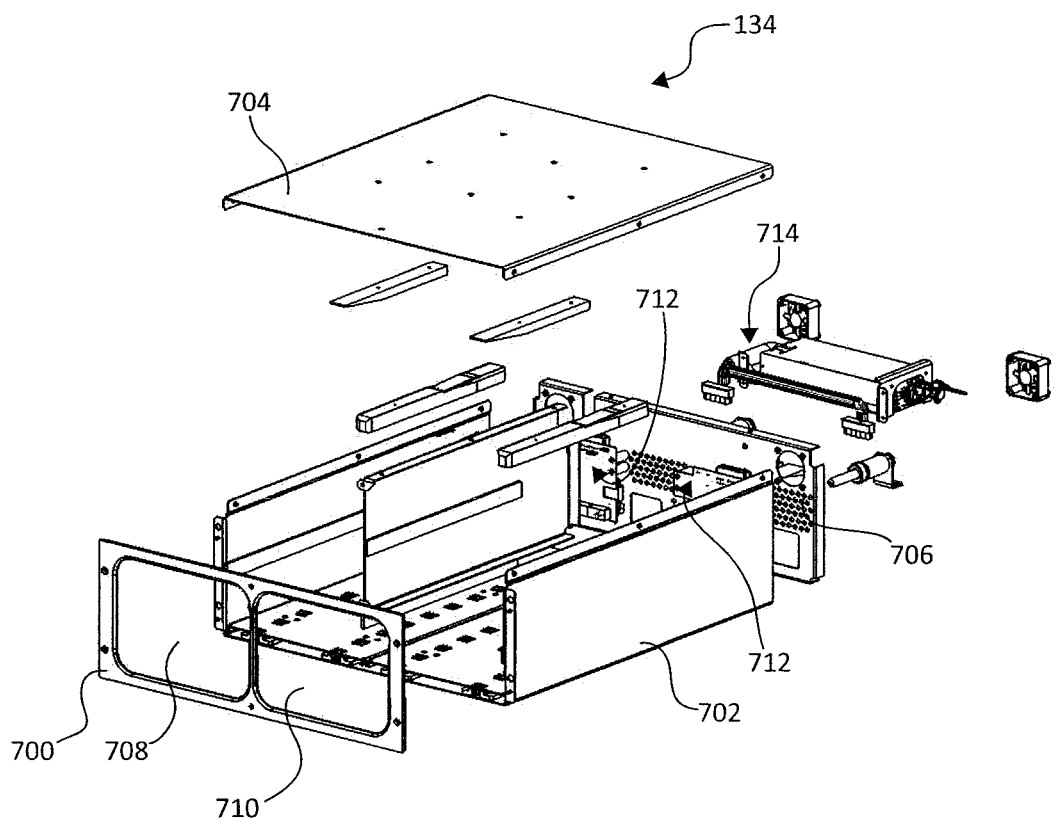
Figure 7B:
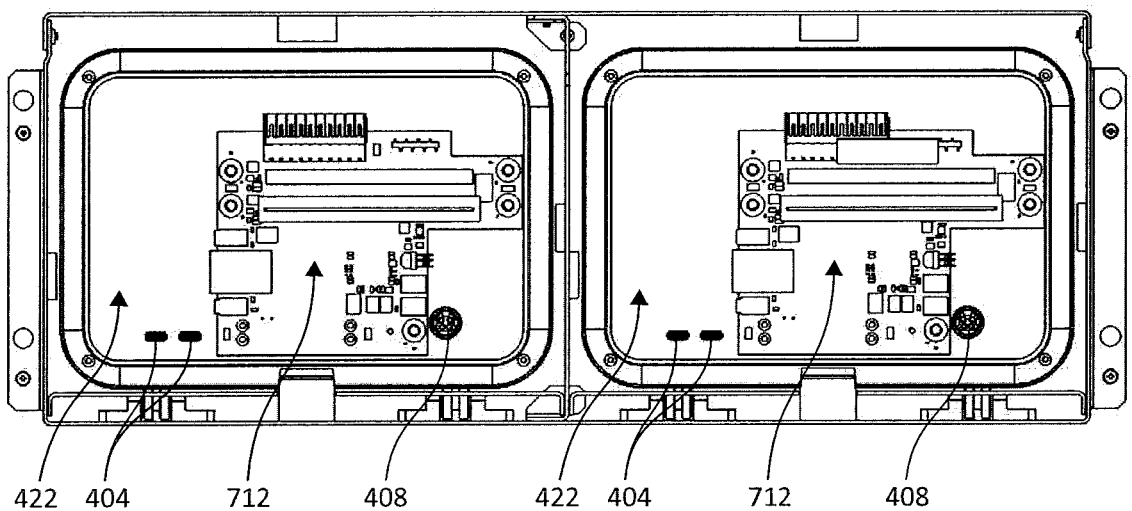

FIG. 7A is an exploded view of rack-mounted docking unit 134 in accordance with one embodiment. In the embodiment of FIG. 7A, rack-mounted docking unit 134 includes a front frame 700, a substantially U-shaped base 702, a top cover 704 and a rear panel 706. Front frame 700 includes openings 708 and 710 that are sized to receive either a multi-drive data storage device 106 or a multi-device dock 110. Rear panel 706 includes high speed connectors (e.g., a PCIe connectors) 712. FIG. 7B is a diagrammatic illustration showing connectors of a back panel 422 of a multi-drive data storage device or a multi-device dock 110 coupled to high speed connectors 712 within the rack-mounted docking unit 134. High speed connectors 712 of rack-mounted docking unit 134 are positioned such that the high speed connectors of back panel 422 mate with connectors 712 when the multi-drive data storage device or a multi-device dock 110 is fully inserted into drawer 134. FRM 714 is included behind rack-mounted docking unit 134 and coupled to high speed connectors 712. FRM 714 converts PCIe signals to other data transfer protocols such as fiber channel, Ethernet or iSCSI, which may be suitable for communicating with data center infrastructure (e.g., a data center server), for example, for copying or cloning the data from the consumer facing device 102, 104, 106.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A modular edge system external to a computing system, comprising:
   a rack-mounted docking unit external to the computing system, the rack-mounted docking unit having a first interfacing connector;
   a multi-drive data storage device, insertable into the rack-mounted docking unit, comprising a plurality of non-removable data storage drives and a back end having a second interfacing connector, the multi-drive data storage device configured to connect to a computer and to store data generated by the computer, and the second interfacing connector configured to operably couple to the first interfacing connector when the multi-drive data storage device is inserted into the rack-mounted docking unit;
   a single-drive data storage device configured to be independently connected to the computer and to store the data generated by the computer; and
   a multi-device dock comprising a plurality of slots, with each of the plurality of slots configured to removably receive the single-drive data storage device, the multi-device dock having a front end comprising an opening into the slots and a back end having a third interfacing connector, the third interfacing connector configured to operably couple the single-drive data storage device to the first interfacing connector when the single-drive data storage device is within one of the plurality of slots and when the multi-device dock is inserted into the rack-mounted docking unit.

2. The system of claim 1, wherein the multi-device dock and the multi-drive data storage device have a substantially same size.

3. The system of claim 1, further comprising a memory card having a size that is smaller than a size of the single-drive data storage device.

4. The system of claim 3, further comprising a memory card ingester configured to receive the memory card and configured to be dockable into the multi-device dock.

5. The system of claim 4, wherein the memory card ingester and the single-drive data storage device have a substantially same size.

6. The system of claim 5, wherein the third interfacing connector is further configured to operably couple the memory card to the first interfacing connector when the memory card ingester is within one of the plurality of slots and when the multi-device dock is inserted into the rack-mounted docking unit.

7. The system of claim 1, wherein the single-drive data storage device comprises a consumer-accessible connector and a high speed connector, and wherein the single-drive data storage device is configured to be independently connected to the computer and to store the data generated by the computer via the consumer-accessible connector, and wherein the high speed connector is configured to couple to the third interfacing connector of the multi-device dock.

8. The system of claim 1, wherein the multi-drive data storage device further comprises a consumer-accessible connector, and wherein the multi-drive data storage device is configured to connect to the computer via the consumer-accessible connector, and wherein the second interfacing connector is a high speed connector.

9. The system of claim 3, further comprising a multi device ingester having a first slot configured to receive the single-drive data storage device, a second slot configured to receive the memory card, and an upper portion that is configured to fit the multi-drive data storage device.

10. The system of claim 1, wherein the first interfacing connector of the rack-mounted docking unit is a high speed connector.

11. The system of claim 1, wherein the first interfacing connector is coupled to a field-replaceable module, the field-replaceable module being coupled between the first interfacing connector and rack infrastructure.

12. A system comprising:
a portable data storage device having a data gathering consumer accessible data interface connector and a first high speed data interface connector;
a rack-mounted docking unit having a second high speed data interface connector and being coupled to a server;
a multi-device dock configured to be inserted into the rack-mounted docking unit, wherein the first high speed data interface connector of the portable data storage device couples to the second high speed data interface connector of the rack-mounted docking unit when the portable data storage device is within a slot of the multi-device dock that is inserted into the rack-mounted docking unit;
a multi-drive data storage device having a data gathering consumer accessible data interface connector, a plurality of non-removable data storage drives, a third high speed data interface connector and is configured to be inserted into the rack-mounted docking unit;
wherein in a data gathering configuration the data gathering consumer accessible data interface connectors of the portable data storage device and the multi-drive data storage device are configured to be removably coupled to an external computer and configured to store data generated by the external computer; and
wherein in a data transfer configuration the portable data storage device is removably inserted into the slot of the multi-device dock, the multi-device dock is removably inserted into the rack-mounted docking unit, the multi-drive data storage device is removably inserted into the rack-mounted docking unit and the second high speed data interface connector of the rack-mounted docking unit couples to the first high speed data interface connector of the portable data storage device and to the third high speed data interface connector of the multi-drive data storage device to transfer the data stored in the portable data storage device and the multi-drive data storage device to the server.

13. The system of claim 12, wherein the portable data storage device comprises a single-drive data storage device.

14. The system of claim 12, wherein the portable data storage device is a memory card ingester having a memory card therein.

15. The system of claim 12, wherein the second high speed data interface connector is coupled to a field-replaceable module, the field-replaceable module being coupled between the second high speed data interface connector and the server.

* * * * *